(12) United States Patent
Takenaka

(10) Patent No.: US 11,588,108 B2
(45) Date of Patent: Feb. 21, 2023

(54) PHOTOELECTRIC CONVERSION DEVICE AND METHOD OF MANUFACTURING PHOTOELECTRIC CONVERSION DEVICE

(71) Applicant: SHARP KABUSHIKI KAISHA, Sakai (JP)

(72) Inventor: Yukio Takenaka, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/410,462

(22) Filed: Aug. 24, 2021

(65) Prior Publication Data
US 2022/0069224 A1 Mar. 3, 2022

(30) Foreign Application Priority Data
Aug. 26, 2020 (JP) .............................. JP2020-142514

(51) Int. Cl.
*H01L 51/00* (2006.01)
*H01L 51/44* (2006.01)
*H01L 51/42* (2006.01)

(52) U.S. Cl.
CPC ...... *H01L 51/0032* (2013.01); *H01L 51/4253* (2013.01); *H01L 51/441* (2013.01)

(58) Field of Classification Search
CPC ............ H01L 51/0032; H01L 51/4253; H01L 51/441
See application file for complete search history.

(56) References Cited

U.S. PATENT DOCUMENTS

| | | | | |
|---|---|---|---|---|
| 2007/0131925 A1* | 6/2007 | Shalk | .................. | H01L 51/0094 257/40 |
| 2016/0005986 A1* | 1/2016 | Guo | .................... | H01L 51/4246 438/82 |
| 2016/0359119 A1* | 12/2016 | Hayashi | .............. | H01L 51/0032 |
| 2019/0348226 A1* | 11/2019 | Sugimura | ........... | H01L 51/0024 |

FOREIGN PATENT DOCUMENTS

JP 2017-126731 A 7/2017

* cited by examiner

*Primary Examiner* — Golam Mowla
(74) *Attorney, Agent, or Firm* — ScienBiziP, P.C.

(57) ABSTRACT

A photoelectric conversion device includes: a first carrier transport layer; a photoelectric conversion layer containing an ionic crystalline compound; and a polysiloxane layer between the first carrier transport layer and the photoelectric conversion layer, the polysiloxane layer containing a polysiloxane having a polar functional group $R^1$.

15 Claims, 4 Drawing Sheets

PHOTOELECTRIC CONVERSION DEVICE AND METHOD OF MANUFACTURING PHOTOELECTRIC CONVERSION DEVICE

CROSS-REFERENCE TO RELATED APPLICATION

The present application claims priority from Japanese Application JP2020-142514, filed Aug. 26, 2020, the content of which is hereby incorporated by reference into this application.

BACK GROUND OF THE INVENTION

1. Field of the Invention

The present invention relates to photoelectric conversion devices and methods of manufacturing photoelectric conversion devices.

2. DESCRIPTION OF THE RELATED ART

Japanese Unexamined Patent Application Publication, Tokukai, No. 2017-126731, as an example, discloses solar cells including a light-absorbing layer containing a perovskite structured compound.

In a photoelectric conversion device for a solar cell described in Japanese Unexamined Patent Application Publication, Tokukai, No. 2017-126731, a solution, in a highly polar solvent such as dimethyl sulfoxide (DMSO), of a precursor to an ionic crystalline compound such as a perovskite structured compound is applied onto a carrier transport layer such as an electron transport layer, for example, in forming a photoelectric conversion layer such as a light-absorbing layer. The carrier transport layer may be dissolved in the highly polar solvent, for example, when the carrier transport layer is a polymer material. Meanwhile, when the carrier transport layer is made of oxide semiconductor nanoparticles, the semiconductor nanoparticles may be washed away in the highly polar solvent. These phenomena would degrade the performance and reliability of the photoelectric conversion device.

The present disclosure has a primary object to provide a more reliable photoelectric conversion device.

The present invention, in an aspect thereof, is directed to a photoelectric conversion device including: a first carrier transport layer; a photoelectric conversion layer containing an ionic crystalline compound; and a polysiloxane layer between the first carrier transport layer and the photoelectric conversion layer, the polysiloxane layer containing a polysiloxane having a polar functional group $R^1$.

DETAILED DESCRIPTION OF THE INVENTION

The following will describe preferred examples of the present invention reduced to practice. The following embodiments are given for illustrative purposes only and by no means limit the scope of the invention.

Embodiment 1

Figure 1:
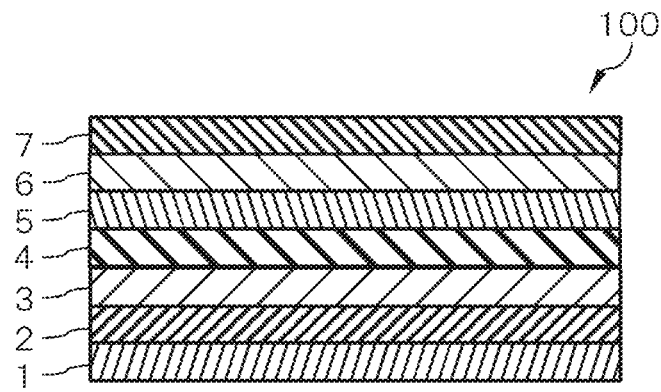
FIG. 1 is a schematic diagram of an exemplary photoelectric conversion device in accordance with Embodiment 1.

FIG. 1 is a schematic diagram of an exemplary photoelectric conversion device in accordance with the present embodiment.

Referring to FIG. 1, a photoelectric conversion device 100 has a structure including a sequential stack of, for example, a substrate 1, a first electrode 2, a first carrier transport layer 3, a polysiloxane layer 4, a photoelectric conversion layer 5, a second carrier transport layer 6, and a second electrode 7. This photoelectric conversion device 100 may be, for example, a light-emitting device in which the first electrode 2 and the second electrode 7 inject electric charges to the photoelectric conversion layer 5 where the electric charges are converted to light and a solar cell or like power generation device in which the photoelectric conversion layer 5 converts incoming external light to electricity so that electricity can be drawn from the first electrode 2 or the second electrode 7.

The substrate 1 is made of, for example, glass and provides a support for the layers named above. The substrate 1 may be, for example, an array substrate carrying, for example, thin film transistors (TFTs) formed thereon.

The first electrode 2 and the second electrode 7 are made of, for example, a metal, transparent conductive oxide, or like conductive material. Examples of the metal include Al, Cu, Au, and Ag. Examples of the transparent conductive oxide include indium tin oxide (ITO), indium zinc oxide (IZO), zinc oxide (ZnO), aluminum zinc oxide (ZnO:Al (AZO)), and boron zinc oxide (ZnO:B (BZO)). The first electrode 2 and the second electrode 7 may be, for example, a stack of layers including at least one metal layer and/or at least one transparent conductive oxide layer.

The first carrier transport layer 3 and the second carrier transport layer 6 transport carriers, or electrons or holes.

The first carrier transport layer 3 and the second carrier transport layer 6 may be made of, for example, a hole transport material or an electron transport material.

Examples of the hole transport material include materials containing at least one species selected from the group consisting of oxides, nitrides, and carbides containing at least any one of elements Zn, Cr, Ni, Ti, Nb, Al, Si, Mg, Ta, Hf, Zr, Y, La, and Sr; materials such as 4,4',4"-tris(9-carbazoyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), and $MoO_3$; and polymer-based hole transport materials such as poly(N-vinylcarbazole) (PVK), poly(2,7-(9,9-di-n-octylfluorene)-(1,4-phenylene-((4-sec-butylphenyl)imino)-1,4-phenylene (TFB), poly(triphenylamine) derivatives (Poly-TPD), and poly(3,4-ethylenedioxythiophene)/poly(4-styrene sulfonate) (PEDOT-PSS). Any one of these hole transport materials may be used alone, or alternatively two or more of them may be used together in any combination as a mixture where necessary.

Examples of the electron transport material include inorganic electron transport materials such as zinc oxides (e.g., ZnO), titanium oxides (e.g., $TiO_2$), tungsten oxides ($WO_3$), molybdenum oxides ($MoO_3$), zirconium oxides ($ZrO_2$), strontium titanium oxides (e.g., $SrTiO_3$); intrinsically conducting polymers such as ethoxylated polyethylenimine (PEIE); and metal complexes with a quinoline moiety or benzoquinoline moiety such as tris(8-quinolinolato) aluminum (abbreviation: Alq), tris(4-methyl-8-quinolinolato) aluminum (abbreviation: Almq3), bis(10-hydroxybenzo[h]quinolinato) berylium (abbreviation: BeBq2), and bis(2-methyl-8-quinolinolato)(4-phenylphenolato) aluminum (abbreviation: BAlq). Other examples include metal complexes containing an oxazole- or thiazole-based ligand(s) such as bis[2-(2-hydroxyphenyl)benzoxazolato]zinc (abbreviation: $Zn(BOX)_2$) and bis[2-(2-hydroxyphenyl)benzothiazolato]zinc (abbreviation: $Zn(BTZ)_2$). Further examples other than metal complexes include organic electron transport materials such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), and bathocuproine (abbreviation: BCP). Any one of these electron transport materials may be used alone, or alternatively two or more of them may be used together in any combination as a mixture where necessary.

The polysiloxane layer 4 contains a polysiloxane with a polar functional group $R^1$. The polar functional group $R^1$, for example, preferably includes, at an end thereof, at least one selected from an amino group, a thiol group, a carboxyl group, and a phosphono group. More specifically, the polar functional group $R^1$ is, for example, a $C_1$-$C_5$ alkyl group with at least one selected from an amino group, a thiol group, a carboxyl group, and a phosphono group at an end thereof.

The polysiloxane with a polar functional group $R^1$ is, for example, the compound of formula (1) below, where $R^2$ may be a polar functional group $R^1$, a hydrogen atom, a hydroxy group (—OH), a $C_1$-$C_3$ lower alkyl group, or a π-conjugated structure, and "n" is a natural number greater than or equal to 10.

Chem. 1

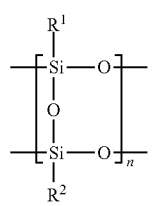

(1)

The polysiloxane including a polar functional group $R^1$ preferably has π-conjugated structures. The π-conjugated structures may be included in the functional group $R^1$. Either of these structures facilitates the movement of carriers through the polysiloxane layer 4. Specific examples of the π-conjugated structures include functional groups with such as a benzene ring structure, a pyridine, a pyrrole, a thiophene, an imidazole, a pyrazole, a carbazole, or an acridine. The structures facilitate the movement of carriers through the polysiloxane layer 4. Specific examples of the π-conjugated structures include functional groups with an organic cyclic structure such as a benzene moiety, a pyridine moiety, a pyrrole moiety, a thiophene moiety, an imidazole moiety, a pyrazole moiety, a carbazole moiety, or an acridine moiety.

The polysiloxane layer 4 preferably has a thickness of less than or equal to 5 nm. This particular structure facilitates the movement of carriers between the photoelectric conversion layer 5 and the first carrier transport layer 3.

The polysiloxane layer 4 may further contain a material for an electron transport layer or a hole transport layer. This material for an electron or hole transport layer may be the same as the material for the first carrier transport layer 3 and the second carrier transport layer 6. Particularly preferred examples include semiconductor nanoparticles of ZnO or NiO capable of transporting carriers. This particular structure facilitates the movement of carriers between the photoelectric conversion layer 5 and the first carrier transport layer 3. The polysiloxane layer 4 is preferably disposed immediately adjacent to the first carrier transport layer 3 and the photoelectric conversion layer 5, in other words, in direct contact with the first carrier transport layer 3 and the photoelectric conversion layer 5.

The photoelectric conversion layer 5, for example, either emits or absorbs light. The photoelectric conversion layer 5 contains an ionic crystalline compound. This ionic crystalline compound, for example, preferably emits light, absorbs light, or transports electric charges. A photoelectric conversion device 100 makes a light-emitting device such as a display device, for example, when the ionic crystalline compound emits light. Meanwhile, for example, when the ionic crystalline compound absorbs light, the photoelectric conversion device 1 makes a power generation device such as a solar cell.

The ionic crystalline compound may be, for example, a perovskite structures compound. Examples of the perovskite structures compound include halides containing at least one anion selected from halogen elements and cations of at least two elements at least selected from the group of Na, Mg, Al, K, Ca, Sc, Mn, Fe, Co, Ni, Cu, Zn, Ga, Ge, As, Rb, Sr, Y, In, Sn, Sb, Cs, Ba, Bi, and lanthanoids. The cations in the perovskite structures compound may be partially a nonmetal cation such as ammonium ions. The photoelectric conversion layer 5 may, for example, contain quantum dots coated with the ionic crystalline compound. The quantum dots either emit or absorb light. The quantum dots may have their surfaces halogenated by the ionic crystalline compound. When the quantum dots have their surfaces halogenated, the quantum dots can be better dispersed in a highly polar solvent such as DMSO, which, for example, renders the resultant photoelectric conversion layer 5 more smooth. The quantum dots may have a core alone or a core/shell structure in which a core is coated by a shell.

Figure 2:
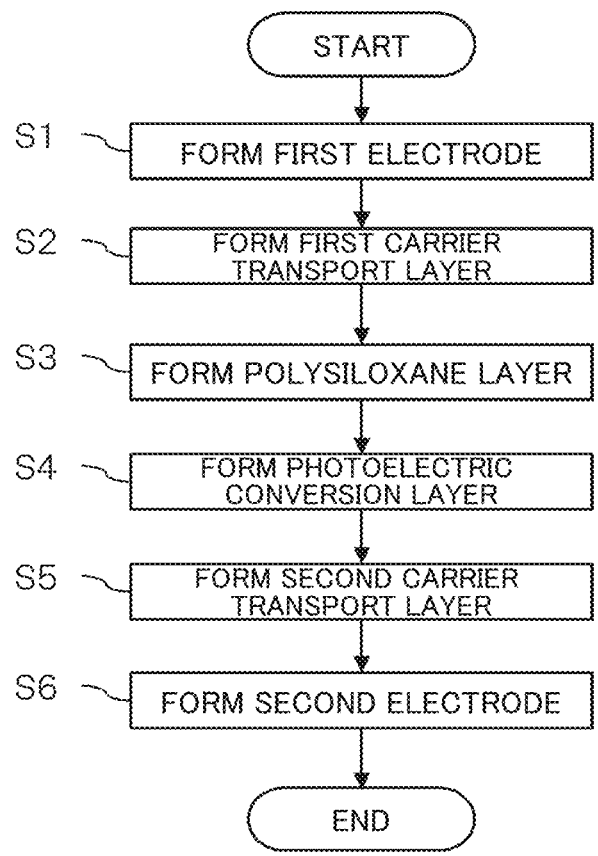
FIG. 2 is a diagram of an exemplary process of manufacturing a photoelectric conversion device in accordance with Embodiment 1.

A description is now given of an exemplary method of manufacturing a photoelectric conversion device with reference to FIG. 2. FIG. 2 depicts an exemplary process of manufacturing a photoelectric conversion device.

Referring to FIG. 2, the first electrode 2 is formed on the substrate 1 (S1). The first electrode 2 can be formed by, for example, various publicly known methods such as sputtering and vacuum vapor deposition.

Next, the first carrier transport layer 3 is formed on the first electrode 2 (S2). The first carrier transport layer 3 can be formed by, for example, various publicly known methods such as vacuum vapor deposition, sputtering, and coating. For instance, the first carrier transport layer 3 is formed by applying a solution of semiconductor nanoparticles of a hole transport material or an electron transport material or a solution of a polymer-based hole transport material or a polymer-based electron transport material.

Next, the polysiloxane layer 4 is formed on the first carrier transport layer 3 (S3). The polysiloxane layer 4 can be formed by, for example, coating. More specifically, the polysiloxane layer 4 can be formed by applying a solution of a precursor to a polysiloxane with a polar functional group $R^1$ onto the first carrier transport layer 3 by, for example, spin-coating and subsequently heating the applied solution. The contact angle of the polysiloxane layer 4 to be formed for a highly polar solvent such as DMSO is preferably adjusted to, for example, 10° to 40°. This particular adjustment can render the resultant first carrier transport layer 3 more smooth on the polysiloxane layer 4.

The precursor to a polysiloxane with a polar functional group $R^1$ is, for example, trialkoxysilane with a polar functional group $R^1$. Examples of the trialkoxysilane with a polar functional group $R^1$ include compounds of formulae (2), (3), (4), and (5) below.

Chem. 2

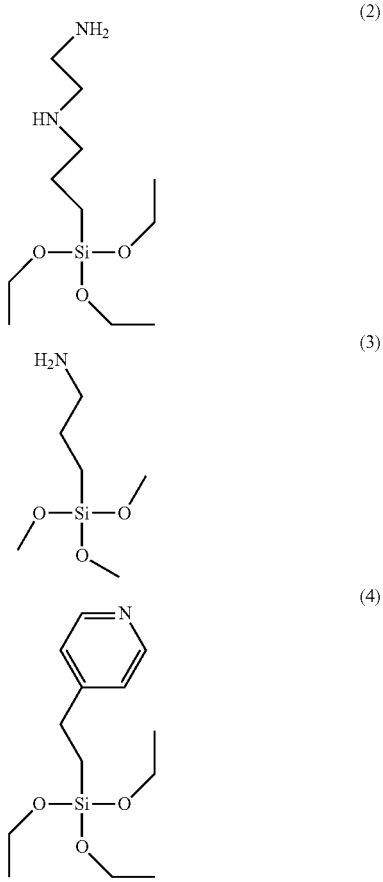

(2)

(3)

(4)

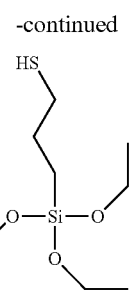

(5)

Next, the photoelectric conversion layer 5 is formed on the polysiloxane layer 4 (S4). The photoelectric conversion layer 5 can be formed by, for example, coating. More specifically, the photoelectric conversion layer 5 containing an ionic crystalline compound can be formed by, for example, spin-coating the polysiloxane layer 4 with a coating solution of a precursor to an ionic crystalline compound in a highly polar solvent and subsequently heating the coating solution.

Examples of the precursor to an ionic crystalline compound include ionic compounds containing cation sources such as halides, oxides, and sulfides containing cation sources. Specific examples include $CsCl$ and $PbCl_2$ having a 1:1 molar ratio, $CsBr$ and $PbBr_2$ having a 1:1 molar ratio, $CsI$ and $PbI_2$ having a 1:1 molar ratio, $CsCl$ and $SnCl_2$ having a 1:1 molar ratio, $CsBr$ and $SnBr_2$ having a 1:1 molar ratio, $CsI$ and $SnI_2$ having a 1:1 molar ratio, $CsCl$ and $ZnCl_2$ having a 1:1 molar ratio, $CsBr$ and $ZnBr_2$ having a 1:1 molar ratio, $CsI$ and $ZnI_2$ having a 1:1 molar ratio, LiF, LiCl, LiBr, NaF, NaCl, NaBr, NaI, KF, KCl, KBr, KI, RbF, RbCl, RbBr, RbI, CsF, CsCl, CsBr, CsI, $CaF_2$, $CaCl_2$), $CaBr_2$, $CaI_2$, CaO, CaS, $MgF_2$, $MgCl_2$, $MgBr_2$, $MgI_2$, MgO, MgS, $Na_2S$, $Rb_2S$, $Cs_2S$, sodium thiocyanate, and potassium thiocyanate.

Examples of the highly polar solvent include DMSO, sulfolane, formamide, N-methyl formamide, N,N-dimethyl formamide, acetamide, N-methyl acetamide, N,N-dimethyl acetamide, acetonitrile, and water.

Next, the second carrier transport layer 6 is formed on the photoelectric conversion layer 5 (S5). The second carrier transport layer 6 can be formed, for example, similarly to S2.

Next, the second electrode 7 is formed on the second carrier transport layer 6 (S6). The second electrode 7 can be formed by, for example, various publicly known methods such as sputtering and vacuum vapor deposition.

This step S6 completes the manufacture of the photoelectric conversion device 1.

Layers formed in examples and comparative examples were evaluated as described in the following.

Example 1

A molar amount of water equal to the number of moles of ethoxy groups in 3-(2-aminoethylamino)propyltriethoxysilane was added to the 3-(2-aminoethylamino)propyltriethoxysilane. The mixture was stirred in ethanol at 60° C. for 12 hours, to obtain a polysiloxane precursor coating solution. This polysiloxane precursor coating solution was spin-coated onto a glass substrate, and the substrate was heated at 100° C. for 1 hour, to form a polysiloxane layer (PAASQ layer) of poly(3-(2-aminoethylamino)propylsiloxane (PAASQ).

Example 2

A molar amount of water equal to the number of moles of ethoxy groups in 3-aminopropyltriethoxysilane was added to the 3-aminopropyltriethoxysilane. The mixture was stirred in ethanol at 60° C. for 12 hours, to obtain a polysiloxane precursor coating solution. This polysiloxane precursor coating solution was spin-coated onto a glass substrate, and the substrate was heated at 100° C. for 1 hour, to form a polysiloxane layer (PASQ layer) of poly3-aminopropylsiloxane (PASQ).

Example 3

A solution of ZnO nanoparticles was spin-coated onto a glass substrate, and the substrate was heated at 120° C. for 1 hour, to form a layer of ZnO nanoparticles on the substrate. The same polysiloxane precursor coating solution as the one used in Example 1 was spin-coated onto the layer of ZnO nanoparticles, and the substrate was heated at 100° C. for 1 hour, to form a polysiloxane layer (PAASQ layer) of poly(3-(2-aminoethylamino)propylsiloxane (PAASQ).

Comparative Example 1

A solution of PEIE was spin-coated onto a glass substrate, and the substrate was heated at 100° C. for 1 hour, to form a layer (PEIE layer) of PEIE.

Comparative Example 2

A solution of PEDOT:PSS was spin-coated onto a glass substrate, and the substrate was heated at 100° C. for 1 hour, to form a layer (PEDOT:PSS layer) of PEDOT:PSS.

Comparative Example 3

The same procedures were followed as in Example 1, except that phenyltriethoxysilane was used in place of 3-(2-aminoethylamino)propyltriethoxysilane of formula (2), to form a polysiloxane layer (PPSQ layer) of polyphenylsiloxane (PPSQ).

The layers obtained in these examples and comparative examples were evaluated in terms of their resistance against DMSO, or a highly polar solvent. Specifically, a large amount of DMSO was dispensed dropwise onto the layers. After 60 seconds, the glass substrates on which the layers had been formed were spun to throw (rinse) off DMSO. This rinsing was done twice. The transmittance of each layer was measured with a Fourier transform infrared spectrophotometer (FTIR: model number FT-700, manufactured by HORIBA) before and after the rinsing. The layers were evaluated in terms of their solubility in DMSO (decreases of the layer) based on the transmittance measurements. The layer was evaluated as being insoluble if the FTIR measurement indicated that the transmittance had not substantially changed before and after the rinsing and as being dissolved if the FTIR measurement indicated that the transmittance had increased. The layers were also evaluated in terms of their wettability for DMSO based on contact angle measurements for 1 μl of DMSO. Results are shown in Table 1.

TABLE 1

| | Layer Composition | Decrease in Thickness in DMSO (%) | Contact Angle for DMSO |
|---|---|---|---|
| Example 1 | PAASQ | 5% | 25° |
| Example 2 | PASQ | 0% | 34° |
| Example 3 | ZnO, PAASQ | 1% | 22° |
| Comparative Example 1 | PEIE | 95% | 17° |
| Comparative Example 2 | PEDOT:PSS | 80% | 11° |
| Comparative Example 3 | PPSQ | 0% | 75° |

Table 1 above shows that the PEIE layer of Comparative Example 1 and the PEDOT:PSS layer of Comparative Example 2 dissolved and are thus damaged in DMSO. In other words, if a new layer is formed on the PEIE layer or the PEDOT:PSS layer using a DMSO solution, the PEIE layer or the PEDPT:PSS layer is likely to dissolve and is damaged, and the resulting photoelectric conversion device is likely to exhibit low performance and reliability.

A zinc perovskite precursor containing CsBr and $ZnBr_2$ having a 1:1 molar ratio was mixed in DMSO with CdS nanoparticles (quantum dots) with the surface ligands thereof replaced by the element Br, to prepare a coating solution for use in forming a perovskite. This coating solution was applied onto the PEDOT:PSS layer of Comparative Example 2, and the substrate was heated to form a zinc perovskite/CdS nanoparticle layer. In this PEDOT:PSS layer, STEM-EDX analysis detected elements that had originated from the zinc perovskite. In other words, elements that had originated from the zinc perovskite contaminated the PEDOT:PSS layer of Comparative Example 2, which would degrade the performance of the PEDPT:PSS layer.

The PAASQ layer of Example 1 and the PPSQ layer of Comparative Example 3 can be both regarded as being insoluble in DMSO and hence not damaged in the DMSO solution. The PPSQ layer however has so poor wettability for DMSO that it is difficult to form a smooth layer on the PPSQ layer by using a DMSO solution. In contrast, the PAASQ layer is insoluble in DMSO and exhibits so good wettability for DMSO that it is possible to form a smooth layer on the PAASQ layer using a DMSO solution.

The coating solution for use in forming a perovskite prepared as above, which was a DMSO solution, was actually applied onto the PPSQ layer and the PAASQ layer, and the substrates were heated to form a zinc perovskite layer. A smooth zinc perovskite layer was only formed on the PAASQ layer.

Figure 3:
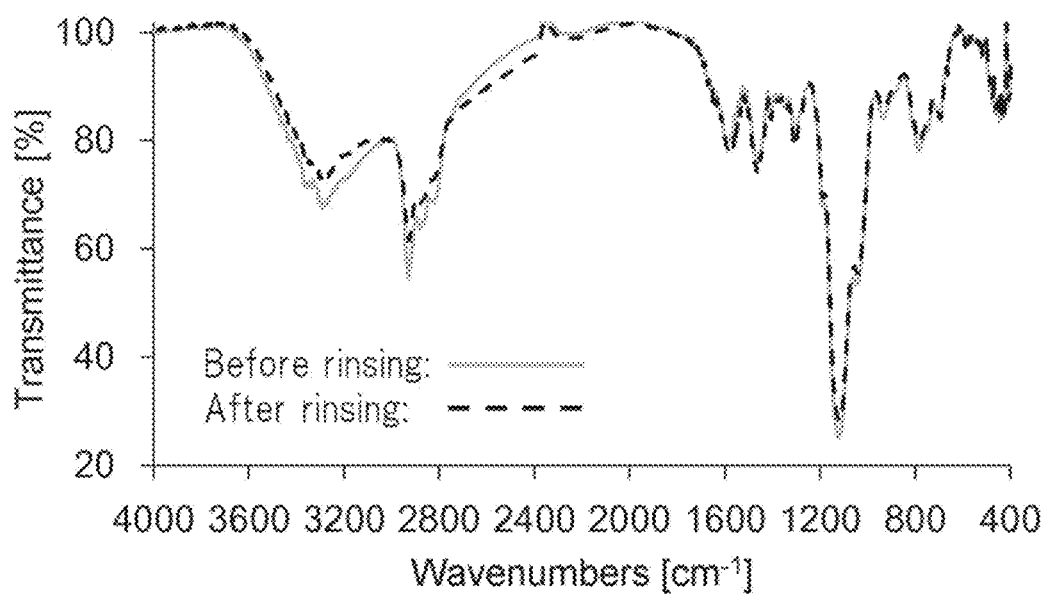
FIG. 3 is a diagram representing FT-IR measurements before and after rinsing a layer in accordance with Example 1.
Figure 4:
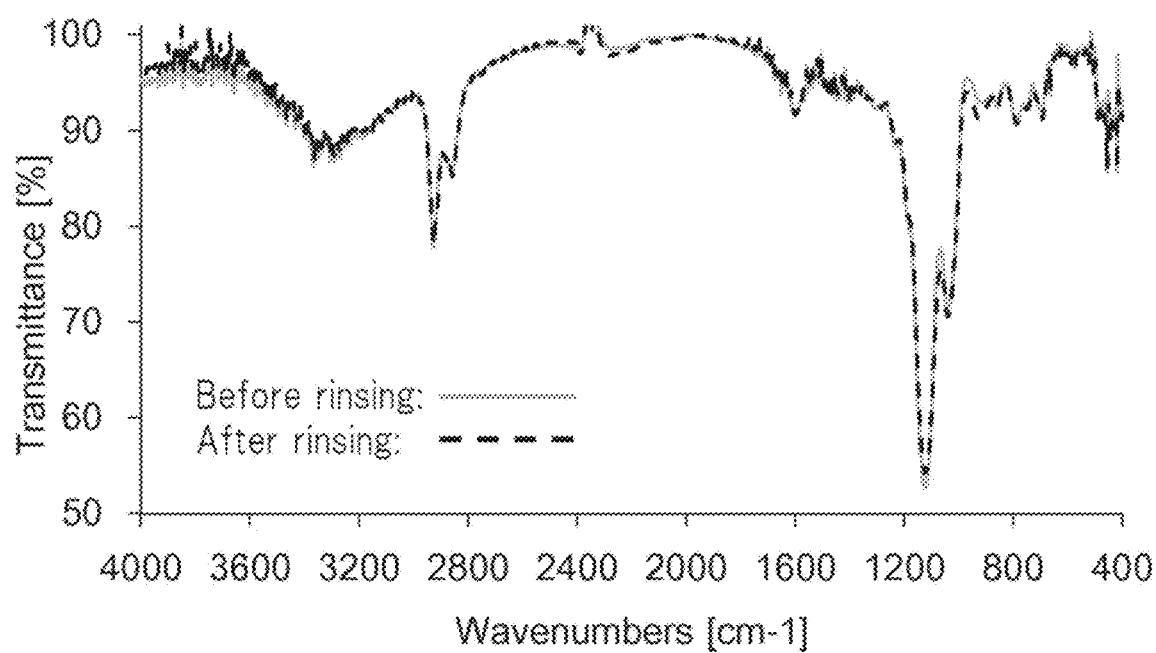
FIG. 4 is a diagram representing FT-IR measurements before and after rising a layer in accordance with Example 2.
Figure 5:
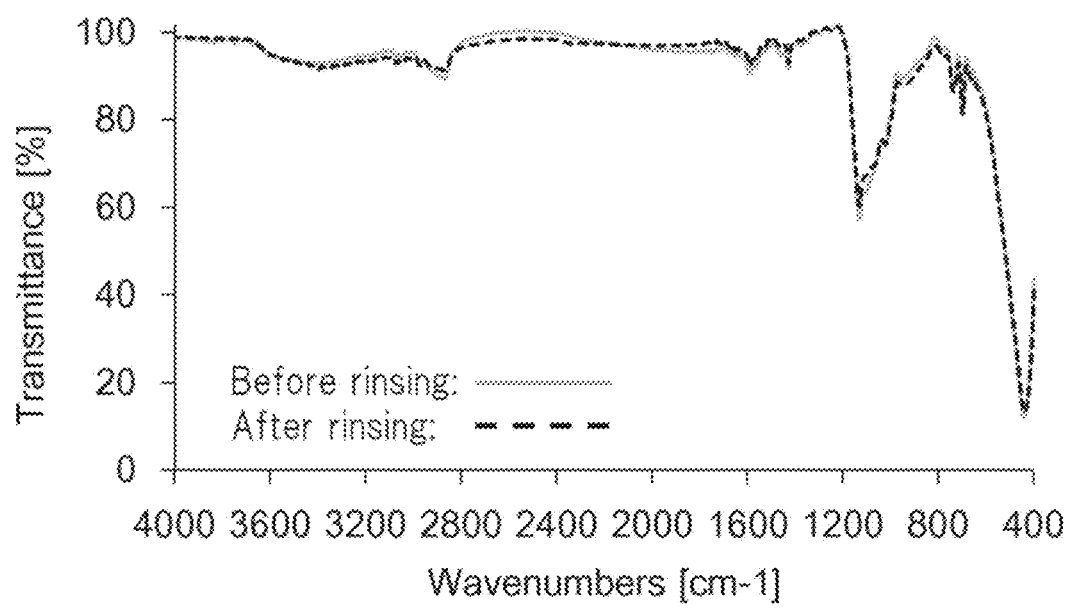
FIG. 5 is a diagram representing FT-IR measurements before and after rising a layer in accordance with Example 3.
Figure 6:
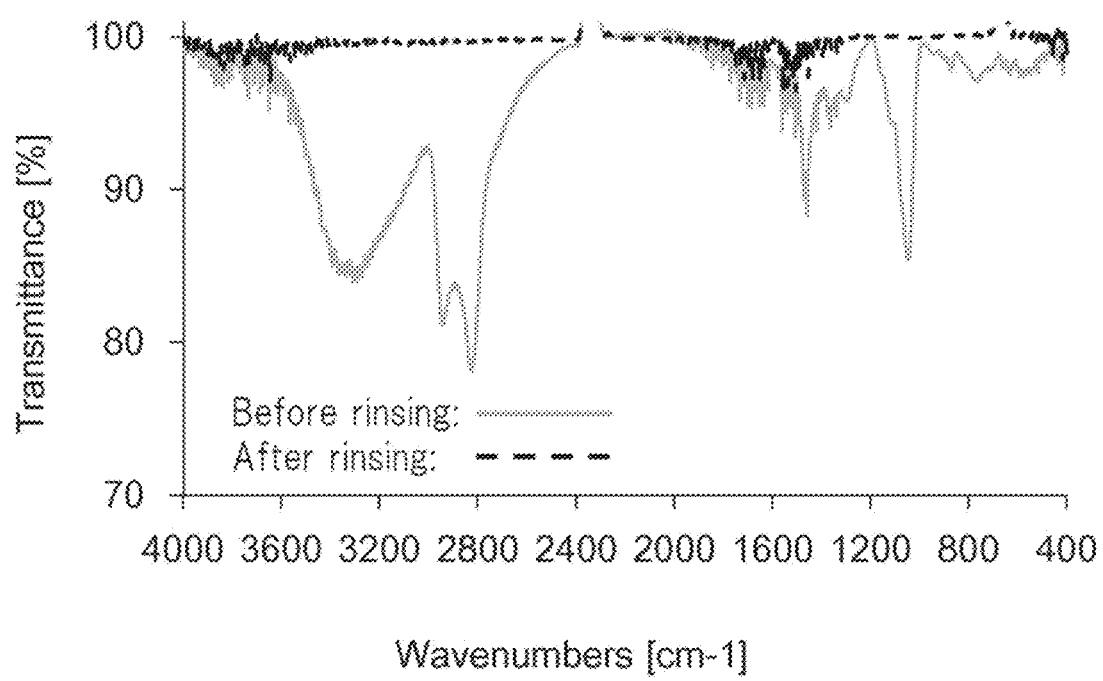
FIG. 6 is a diagram representing FT-IR measurements before and after rising a layer in accordance with Comparative Example 1.
Figure 7:
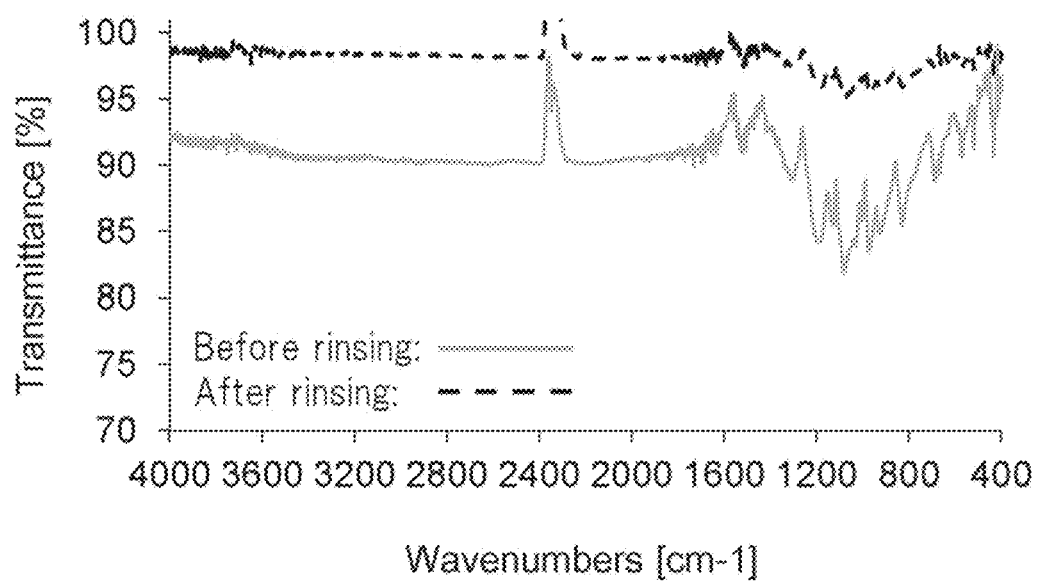
FIG. 7 is a diagram representing FT-IR measurements before and after rising a layer in accordance with Comparative Example 2.
Figure 8:
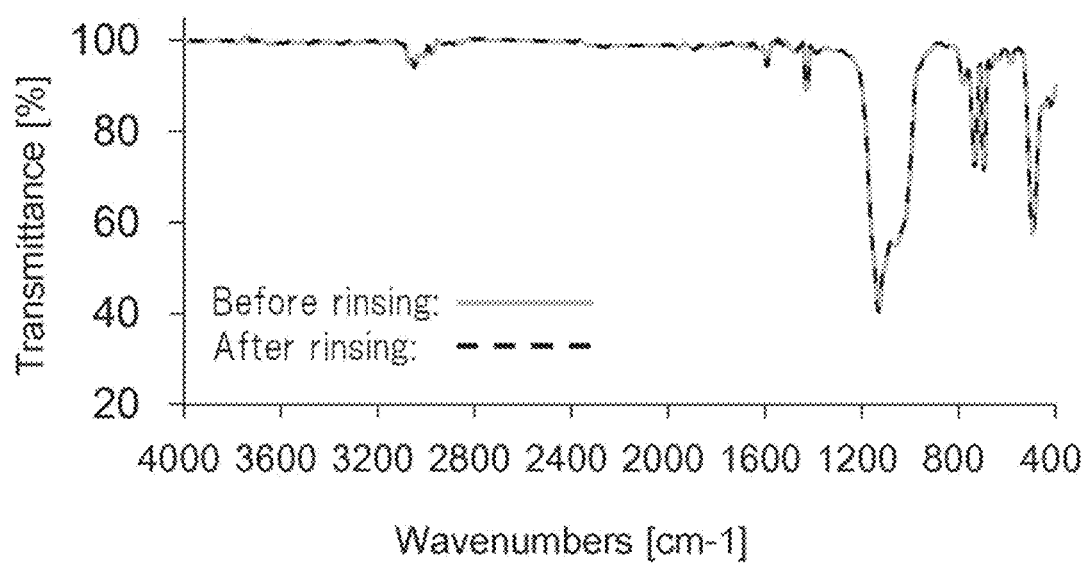
FIG. 8 is a diagram representing FT-IR measurements before and after rising a layer in accordance with Comparative Example 3.

FIG. 3 represents FTIR measurements of the transmittance of the layer of Example 1 for infrared light before and after the rinsing. FIG. 4 represents FTIR measurements of the transmittance of the layer of Example 2 for infrared light before and after the rinsing. FIG. 5 represents FTIR measurements of the transmittance of the layer of Example 3 for infrared light before and after the rinsing. FIG. 6 represents FTIR measurements of the transmittance of the layer of Comparative Example 1 for infrared light before and after the rinsing. FIG. 7 represents FTIR measurements of the transmittance of the layer of Comparative Example 2 for infrared light before and after the rinsing. FIG. 8 represents FTIR measurements of the transmittance of the layer of Comparative Example 3 for infrared light before and after the rinsing.

FIGS. 3 to 5 show that the FTIR measurements of transmittance did not substantially change in the layers of Examples 1 to 3 before and after the rinsing. In particular, FIG. 5 shows that there occurred no decreases not only in absorption by PAASQ, but also in absorption by ZnO near 440 cm$^{-1}$ and the absorption spectrum attributable to ZnO. That in turn demonstrates that the dispersing of ZnO nanoparticles in the PAASQ layer also restrained dissolution of ZnO nanoparticles in the polar solvent.

In contrast, FIGS. 6 and 7 show that the FTIR measurements of transmittance changed significantly in the layers of Comparative Examples 1 and 2 before and after the rinsing. The absorption spectrum attributable to PEIE and PEDOT:PSS decreased significantly in the layers of Comparative Examples 1 and 2 respectively before and after the rinsing.

The present invention is not limited to the description of the embodiments and examples above. Any structure detailed in the embodiments and examples may be replaced by a practically identical structure, a structure that achieves the same effect and function, or a structure that achieves the same purpose.

What is claimed is:

1. A photoelectric conversion device comprising:
   a first carrier transport layer;
   a photoelectric conversion layer containing an ionic crystalline compound;
   a polysiloxane layer between the first carrier transport layer and the photoelectric conversion layer, the polysiloxane layer containing a polysiloxane having a polar functional group,
   a first electrode;
   a second electrode opposite the first electrode, wherein the first electrode, the first carrier transport layer, the polysiloxane layer, the photoelectric conversion layer, and the second electrode are stacked in this sequence; and
   a second carrier transport layer between the photoelectric conversion layer and the second electrode.

2. The photoelectric conversion device according to claim 1, wherein the ionic crystalline compound is a perovskite structured compound.

3. The photoelectric conversion device according to claim 1, wherein the polar functional group includes at least one selected from an amino group, a thiol group, a carboxyl group, and a phosphono group.

4. The photoelectric conversion device according to claim 3, wherein the polar functional group is a C$_1$-C$_5$ alkyl group including, at an end thereof, at least one selected from an amino group, a thiol group, a carboxyl group, and a phosphono group.

5. The photoelectric conversion device according to claim 1, wherein the polysiloxane is of formula (1)

Chem. 1

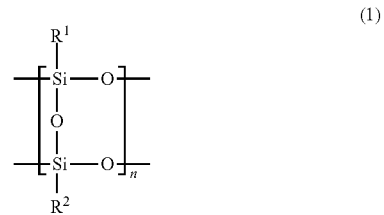

(1)

where R$^1$ is the polar functional group, R$^2$ is at least one species selected from R$^1$, a hydrogen atom, a hydroxy group, a C$_1$-C$_3$ lower alkyl group, and a π-conjugated backbone, and n is a natural number greater than or equal to 10.

6. The photoelectric conversion device according to claim 1, wherein the polysiloxane includes organic groups having π-conjugated structures.

7. The photoelectric conversion device according to claim 1, wherein the organic groups having π-conjugated structures includes at least one species selected from benzene moiety, pyridine moiety, pyrrole moiety, thiophene moiety, imidazole moiety, pyrazole moiety, carbazole moiety, and an acridine moiety.

8. The photoelectric conversion device according to claim 1, wherein the polysiloxane layer has a thickness of less than or equal to 5 nm.

9. The photoelectric conversion device according to claim 1, wherein the polysiloxane layer contains semiconductor nanoparticles.

10. The photoelectric conversion device according to claim 1, wherein the photoelectric conversion layer contains quantum dots.

11. The photoelectric conversion device according to claim 1, wherein the photoelectric conversion layer is a light-emitting layer in which electrons and holes transported from the first electrode or the second electrode recombine to emit light.

12. The photoelectric conversion device according to claim 1, wherein the photoelectric conversion layer is a light-absorbing layer that absorbs external light.

13. The photoelectric conversion device according to claim 1, wherein the polysiloxane layer has a thickness of less than or equal to 5 nm and contains semiconductor nanoparticles.

14. The photoelectric conversion device according to claim 1, wherein
   the polysiloxane layer has a thickness of less than or equal to 5 nm, and
   the photoelectric conversion layer contains quantum dots.

15. The photoelectric conversion device according to claim 1, wherein
   the polysiloxane layer contains semiconductor nanoparticles, and
   the photoelectric conversion layer contains quantum dots.

* * * * *